United States Patent
Haley et al.

(10) Patent No.: US 6,355,576 B1
(45) Date of Patent: Mar. 12, 2002

(54) METHOD FOR CLEANING INTEGRATED CIRCUIT BONDING PADS

(75) Inventors: Mark Haley, Rio Medina; Delbert Parks, Bexar; Judy Galloway, Fair Oaks, all of TX (US)

(73) Assignee: VLSI Technology Inc., San Jose, CA (US)

( * ) Notice: Subject to any disclaimer, the term of this patent is extended or adjusted under 35 U.S.C. 154(b) by 0 days.

(21) Appl. No.: 09/299,682

(22) Filed: Apr. 26, 1999

(51) Int. Cl.$^7$ .............................................. H01L 21/461
(52) U.S. Cl. ........................ 438/745; 438/725; 438/704; 438/974; 438/963
(58) Field of Search ............................... 438/745, 725, 438/974, 963, 704

(56) References Cited

U.S. PATENT DOCUMENTS

| | | | |
|---|---|---|---|
| 5,599,743 A | * 2/1997 | Nakagawa et al. | 437/194 |
| 5,630,904 A | * 5/1997 | Aoyama et al. | 438/669 |
| 5,660,681 A | * 8/1997 | Fukuda et al. | 438/695 |
| 5,705,419 A | * 1/1998 | Perry et al. | 437/48 |
| 5,770,523 A | * 6/1998 | Hung et al. | 438/725 |
| 5,895,245 A | * 4/1999 | Harvey et al. | 438/305 |
| 5,925,577 A | * 7/1999 | Solis | 438/725 |
| 5,930,664 A | * 7/1999 | Hsu et al. | 438/612 |
| 5,970,376 A | * 10/1999 | Chen | 438/637 |
| 6,043,165 A | * 3/2000 | Park et al. | 438/759 |

OTHER PUBLICATIONS

K.H. Ernst, D. Grman, R. Hauert. E. Hollander; Flourine–induced Corrosion of Aluminum Microchip Bond Pads; an XPS and Analysis, Surface and Interface Analysis, vol. 21, 691–696 (1994).

* cited by examiner

*Primary Examiner*—Eddie Lee
*Assistant Examiner*—N. Drew Richards
(74) *Attorney, Agent, or Firm*—Oppenheimer Wolff & Donnelly LLP

(57) ABSTRACT

A method for cleaning bonding pads on a semiconductor device, as disclosed herein, includes treating the bonding pads with a $CF_4$ and water vapor combination. In the process, the water vapor breaks up and the hydrogen from the water vapor couples to fluorine residue on the bonding pad surface creating a volatile HF vapor. In addition, fluorine from the $CF_4$ exchanges with the titanium in the metallic polymer residue making the polymer more soluble for the organic strip operation which follows. Next, the resist is ashed and then an organic resist stripper is applied to the bonding pad area, thereby creating a clean bonding pad surface. Thereafter, a reliable bond wire connection can be made to the bonding pad.

1 Claim, 3 Drawing Sheets

METHOD FOR CLEANING INTEGRATED CIRCUIT BONDING PADS

BACKGROUND OF THE INVENTION

This invention relates generally to semiconductor processing and, more particularly to methods for processing wafers in preparation for wire bonding.

In the manufacture of integrated circuits, a conductive metal pad, such as aluminum copper alloy (ALCu) pad, is typically used allow the electrical connection between active elements of the integrated circuit the external world. More specifically, gold wires or bumps are typically connected to bonding pads formed of this uppermost layer of metal.

In the fabrication of integrated circuits, after the uppermost metal layer is formed, an insulating or dielectric "blanket" layer is deposited over the metal layer. Thereafter, to enable external electrical conuections to the chip, vias are etched through the blanket layer to expose portions of the underlying metal layer. These exposed regions of the metal layer are called "bonding pads." A clean, residue-free bonding pad surface is desired for optimal bonding of the bond wires to the bonding pads. Otherwise, residues on the bonding pad surface can degrade the reliability of the wire bonds. However, conventional processes for forming bonding pads do not tend to produce clean, residue-free bonding pads.

A conventional process for forming a bonding pad is shown in FIGS. 1-4. FIG. 1 shows a typical bonding pad region 10 of an integrated circuit. The layers that compose the region begin with the uppermost metal layer 12, typically AL. Above the metal layer, an optional titanium nitride (TiN) or titanium tungsten (TiW) alloy layer 14 is provided for the bonding pad surface. Above the alloy layer, are dialectic layers composed of silicon dioxide 16 and silicon nitride 18. A resist mask 20 is then deposited above the dielectric layers to facilitate the pad etch process.

FIG. 2 shows the bonding pad region 10 after a typical pad etch. Using a dielectric etcher and gases 22 such as $CHF_3$, $CF_4$, or $SF_6$, the nitride 18, oxide 16, and alloy 18 layers are all etched. This etch exposes the uppermost metal layer 12, thus creating a bonding pad area 24. However, the etch process leaves fluorine residues 26 on the pad surface 24, and metallic polymers 28 on the sidewalls. The fluorine residues 26 bond with the underlying AlCu, and cannot be easily removed.

After the pad etch, an asher is typically used to ash the resist 20. FIG. 3 shows the bonding pad region after an ash treatment. The resist 20 has been removed exposing the upper surface of the nitride 18 dielectric layer. After the resist is ashed, a wet cleaning is performed on the bonding pad to remove residue. The wet cleaning, however, cannot remove all the etch process residue 26, since much of the fluorine residue has bonded to the bonding pad. In addition, the metallic polymers 28 are not soluble in the solvents normally used, thus they remain on the sidewall after wet cleaning.

If the wafer is allowed to sit for any amount of time, or if it collects any kind of moisture, the fluorine residue 26 in the bond pad 24 will migrate to the surface and form a fluorine crystal 30. This crystal prevents a reliable bond with the bond pad surface. Thus, a bond wire 32 may break away from the bond pad 24 after bonding, or form a high resistance connection to the bonding pad.

Bonding pad failure reduces the yield of functional integrated circuits, and thus increases their cost. Further, poor bonding pad connections reduce the reliability of the integrated circuits.

In view of the above, it is apparent that an improved process for creating a clean, reliable bonding pad surfaces is required. Such a process should not leave substantial imbedded residue in the bonding pad surface. In addition, it should meet the demands of high volume manufacturing by not requiring undue time to execute, or additional machinery.

SUMMARY OF THE INVENTION

The present invention meets the aforementioned requirements by providing a process that treats a bond pad surface with a $CF_4$ and water vapor combination. This volatizes the fluorine from the bond pad surface and softens the metallic polymers adhering to the sidewalls. In the process, hydrogen from the water vapor breaks up and couples to the fluorine creating HF, which is volatile in a plasma. As a result, the fluorine is removed from the bond pad surface before it has a chance to crystallize, resulting in a clean bond pad surface. The invention produces clean, reliable bonding pad surfaces resulting in drastically reduced bond wire failure. Furthermore, it does not require undue time to perform and requires no additional machinery.

One aspect of the present invention teaches a method for treating a bond pad surface with a $CF_4$ and water vapor combination. During the process, the $CF_4$ and water vapor are ionized. The ionization causes the hydrogen from the ionized water to combine with the fluorine residue on the bonding pad surface, creating a volatile HF vapor. In addition, fluorine from the ionized $CF_4$ exchanges with metal from the metallic polymer residue causing the polymers to soften. The process then includes ashing the resist layer, followed by stripping the wafer in a liquid solvent to remove contaminants including the metallic polymers. This process prevents fluorine crystallization and provides a clean bond pad surface.

Another aspect of the present invention teaches a system for cleaning integrated circuit bonding pads including a plasma asher, an organic stripper, and back end processors for completing the chips. The asher must be capable of treating an integrated circuit with a $CF_4$ and water vapor combination to volatize the fluorine and soften the metallic polymers.

These and other advantages of the present invention will become apparent to those skilled in the art upon a reading of the following descriptions and study of the various figures of the drawings.

DETAILED DESCRIPTION OF THE PREFERRED EMBODIMENTS

Figure 1:
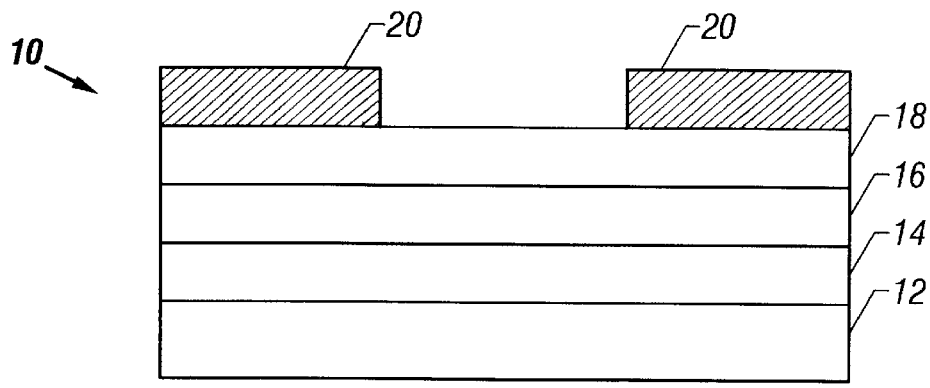
FIG. 1 is a cross-sectional view of a prior art bonding pad region.
Figure 2:
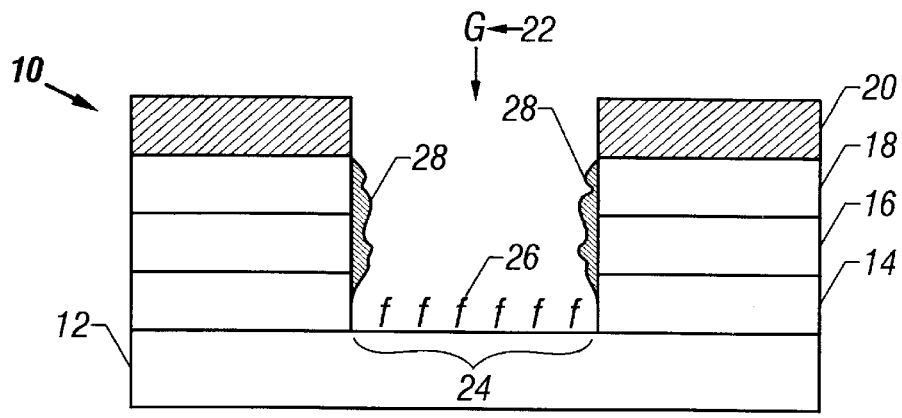
FIG. 2 is a cross-sectional view of a prior art bonding pad region after a pad etch.
Figure 3:
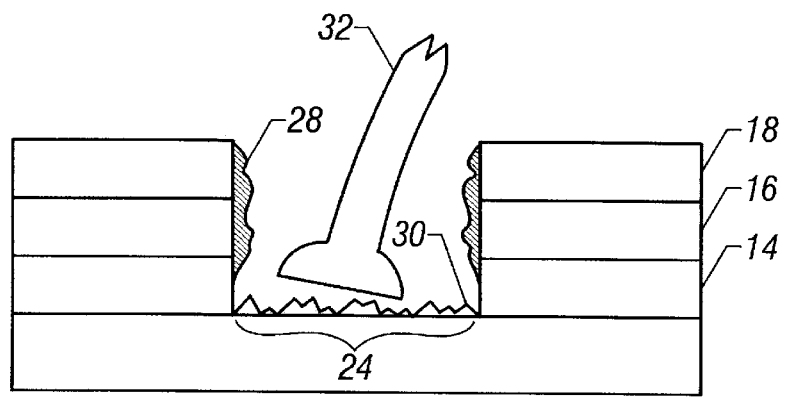
FIG. 3 is a cross-sectional view of a prior art bonding pad region after ashing.
Figure 4:
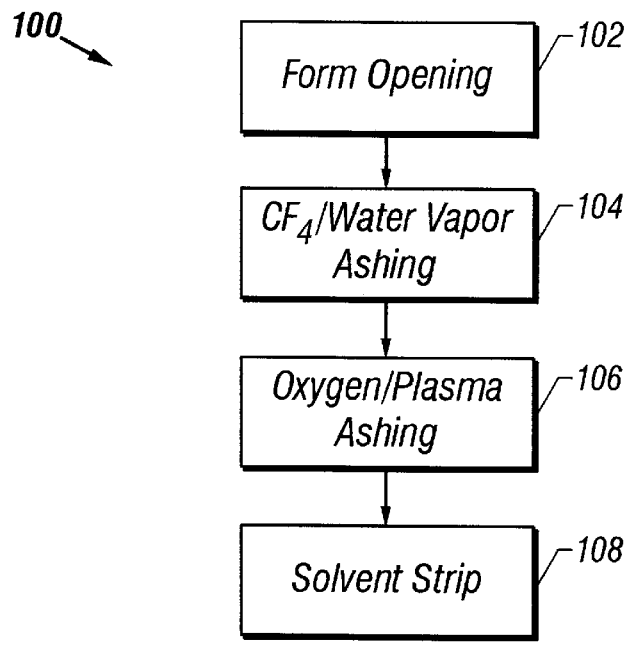
FIG. 4 is a flow chart illustrating one method for producing clean bonding pads in accordance with the present invention.

FIGS. 1–3 were described with reference to the prior art. With reference to FIG. 4, a method 100 for producing a clean bonding pad in accordance with one aspect of the present invention will now be described. In the initial operation 102, an opening is formed in the dielectric and alloy layers. For example, an opening can be formed through nitride 18, oxide 16, and TiN (or TiW) 14 layers of the wafer (see FIG. 5). The etch process is usually accomplished in a dielectric etcher using a gas 22 such as $CF_4$. However, other gases such as $CHF_3$, $SF_6$, or $C_2F_6$, are suitable for use in the etching process.

Operation 102 generally leaves residues such as TiN, $TiF_x$, $TiO_xF_y$, C, F, or $CF_x$, on the AlCu surface, which should be removed before the F in the residue migrates to the surface and crystallizes, thus degrading the reliability of the wire bonds. In addition, this operation also leaves polymers 28 on the sidewalls caused mostly by sputtering from the surface of the materials as they are being reacted. For example, the TiN or TiW gets sputtered into the polymer 28 giving the polymer a metallic component, thus making it hard to strip. The present invention uses a $CF_4$/water vapor combination to soften this metallc polymer and remove the fluorine residue, as discussed below in operation 104.

In the next operation 104, the bonding pad is treated with a $CF_4$, water vapor, and possibly a diluent, such as nitrogen, combination in a microwave or RIE plasma. This combination volatizes the fluorine in the bond pad surface and softens the metallic polymers adhering to the sidewalls. In the process, the water vapor breaks up and the hydrogen from the water vapor couples to the fluorine residue 26 creating HF, which is volatile in the plasma. Thus, the fluorine is removed from the ALCu before it has a chance to crystallize on the bonding pad surface 24. In addition, fluorine from the $CF_4$ exchanges with the titanium in the metallic polymer 28 making the polymer more soluble for the organic strip operation which follows. This operation can be performed on a microwave asher such the Lam Research Corp. microwave asher. Another suitable device with which to perform this operation is the ash chamber of the Lam Research Corp. 9600SE metal etcher. Using this tool, 650 sccm $H_2O$ is combined with 200sccm $CF_4$. The device is set at: 1000 W, 1.2 torr, 200° C. for 30 sec. Note, this is just one example of a tool that may be used for this operation. Other tools are available that may be used to perform the same process.

In the next operation 106, an oxygen plasma combined with varying ratios of water vapor is used to ash the resist mask 20. The oxygen helps to increase photoresist ash rate, while the water vapor liberates the attached fluorine and any free fluorine remaining.

Finally, in operation 108, an organic resist stripper is applied to remove any remaining polymer. Particularly, C compounds remaining on the ALCu surface and sidewalls are removed by this process. However, this operation also helps remove any remaining polymer.

Figure 5:
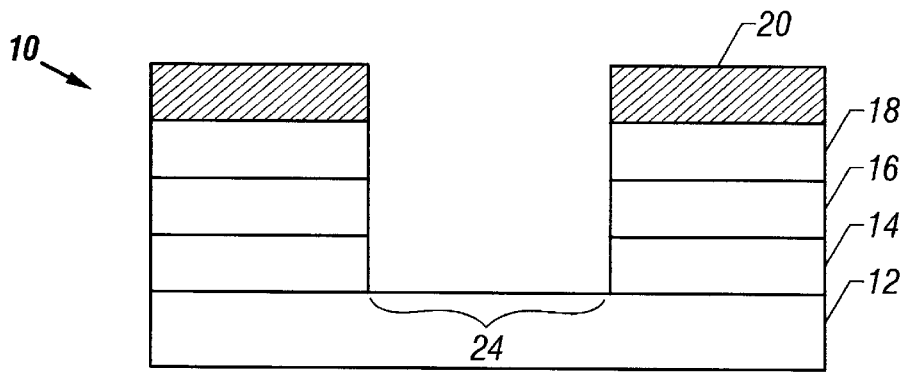
FIG. 5 is a cross-sectional view of a bonding pad region of the present invention after etching the dielectric/alloy layers and treating the bond pad with a $CF_4$/water vapor combination.

FIG. 5 is cross-sectional view of the bonding pad region 10 of the present invention after operation 104 of method 100 is applied. The bond pad surface 24 is substantially free of fluorine residue 26. The removal of the fluorine from the surface prevents fluorine crystallization should the wafer be allowed to sit for a length of time, or collect any moisture. In addition, the sidewalls are free from any metallic polymers 28, since the fluorine from the $CF_4$ exchanges with the titanium in the metallic polymer 28. Therefore, any polymer remaining after operation 104 will be devoid of a metallic component, and thus more soluble in an organic strip.

Figure 6:
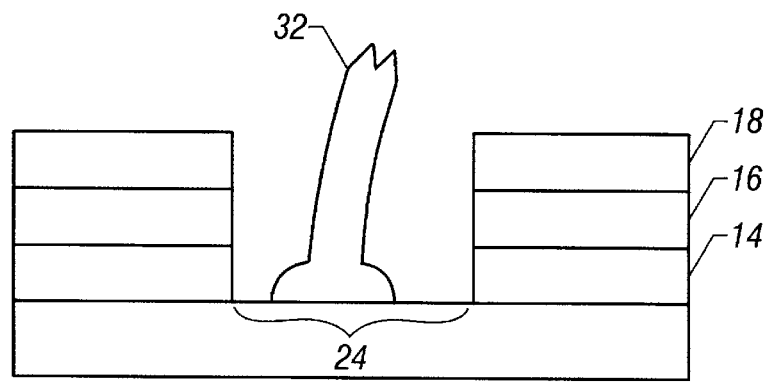
FIG. 6 is a cross-sectional view of the bonding pad region of the present invention after bond wire attachment.

FIG. 6 is a cross-sectional view of the bonding pad region of the present invention after method 100 is completed and a bond wire attached. The resist has been ashed and an organic strip has been applied, removing any remaining polymers. A gold bond wire has also been attached to the bonding pad surface 24. Since the bonding pad surface 24 is free of any fluorine crystallization, a reliable bond wire 32 attachment can be achieved.

In addition to increasing bond wire reliability, the present invention also increases the amount of storage time for the wafer. Prior to the present invention, if the wafer was allowed to sit for a length of time, or was allowed to collect any kind of moisture, the fluorine trapped in the bonding pad surfaces 24 would migrate to the surface and form a fluorine crystal. This crystal structure would prevent reliable wire bonding to the chip. The present invention avoids this by removing fluorine residue remaining on the bonding pad surface. This substantially eliminates fluorine crystallization on the bonding pad surface caused by long storage times or moisture, thus allowing for longer storage periods and greatly improved wire bond reliability.

Figure 7:
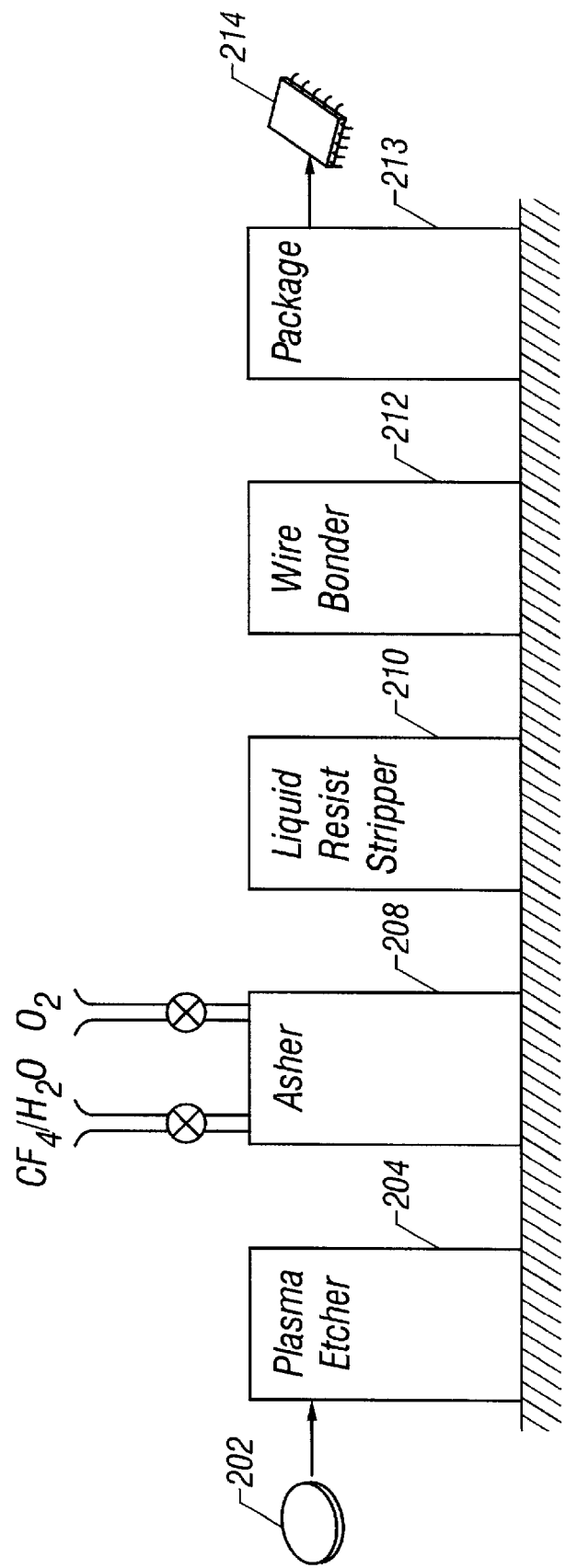
FIG. 7 is an illustration of a system for producing clean bonding pads in accordance with the present invention.

FIG. 7 illustrates a system 200 for producing clean bonding pads in accordance with one aspect of the present invention. The system begins with a wafer 202 ready to receive bonding pads. In the initial part 204 of the system, a plasma etcher is used to etch the dielectric, nitride 18 and oxide 16, and alloy layers, TiN (or TiW) 14, to create the bond pad. The etch is usually done using a gas 22 such as $CF_4$. However, other gases such as $CHF_3$, $SF_6$, or $C_2F_6$, are suitable for use in the etcher. This operation generally leaves residues such as TiN, $TiF_x$, $TiO_xF_y$, C, F, or $CF_x$ on the AlCu surface, which should be removed before the F in the residue migrates to the surface and crystallizes, thus degrading the reliability of the wire bonds. In addition, this operation also leaves polymers 28 on the sidewalls caused mostly by sputtering from the surface of the materials as they are being reacted. The present invention uses a $CF_4$/water vapor combination to soften the metallc polymer and remove the fluorine residue, as discussed below.

In the next part of the system 208, the wafer is placed in a plasma asher. The asher is used to treat the bonding pad with a $CF_4$, water vapor, and possibly a diluent, such as nitrogen, combination in a microwave or RIE plasma. This combination volatizes the fluorine in the bond pad surface and softens the metallic polymers adhering to the sidewalls. The water vapor breaks up and the hydrogen from the water vapor couples to the fluorine residue 26 creating HF, which is volatile in the plasma. Thus, the fluorine is removed from the ALCu before it has a chance to crystallize on the bonding pad surface 24. In addition, fluorine from the $CF_4$ exchanges with the titanium in the metallic polymer 28 making the polymer more soluble for the organic stripper. The asher used in this part of the system may be a microwave asher such the Lam Research Corp. microwave asher. Another suitable device is the ash chamber of the Lam Research Corp. 9600SE metal etcher. Using this tool, 650 sccm $H_2O$ is combined with 200 sccm $CF_4$. The device is set at: 1000 W, 1.2 torr, 200° C. for 30 sec. Note, this is just one example of a tool that may be used in this system. Other tools are available that may also be used in the system of the present invention.

The asher is then used to apply an oxygen plasma combined with varying ratios of water vapor to ash the resist mask 20. The oxygen helps to increase photoresist ash rate, while the water vapor liberates the attached fluorine or any free fluorine remaining.

In the next part of the system 210, an organic resist stripper is used to remove any remaining polymer. Particularly, C compounds remaining on the ALCu surface and sidewalls are removed by this process. However, this operation also helps remove any remaining polymer.

In the next part of the system 212, gold bond wires are attached to the bonding pads. The gold wires, or bumps, are connected to the ALCu surface of the bonding pad 24. Bonding is most successful when a clean, residue-free AlCu surface is available for bonding. The wire bond will be degraded by fluorine crystal and other residues on the bonding pad surface. The present invention increases bond wire reliability by producing clean, residue-free bonding pads. Wafers resulting from the system of the present invention may also be stored longer and with less thought of preventing moister than has been previously possible, since crystallization is substantially prevented by the removal of the fluorine from the bonding pad surface as discussed above.

Finally, in the final part of the system 213, back end processors are used to complete the chips 214 and the chips are packaged.

The results of the system are integrated circuits having reliable bonding wire attachments resulting in drastically reduced bond wire failure. Furthermore, the system does not require undue time to perform and requires no additional machinery. As previously stated, existing machinery can be used in the system, such as the Lam Research Corp. microwave asher, or the ash chamber of the Lam Research Corp. metal etcher.

While this invention has been described in terms of several preferred embodiments, it is contemplated that alternatives, modifications, permutations and equivalents thereof will become apparent to those skilled in the art upon a reading of the specification and study of the drawings. It is therefore intended that the following appended claims include all such alternatives, modifications, permutations and equivalents as fall within the true spirit and scope of the present invention.

What is claimed is:

1. A method for cleaning integrated circuit contacts comprising:

treating an integrated circuit having at least one metal contact aligned with an opening provided through a passivation layer and a resist layer with $CF_4$, water vapor and a diluent to volatize fluorine from said metal contact and to soften metallic polymers adhering to sidewalls of said opening wherein said diluent is Nitrogen; ashing said integrated circuit to substantially remove said resist layer; and stripping said integrated circuit in a liquid solvent to substantially remove contaminants including said softened metallic polymers.

* * * * *